United States Patent
Richter et al.

(10) Patent No.: US 10,319,732 B2
(45) Date of Patent: Jun. 11, 2019

(54) TRANSISTOR ELEMENT INCLUDING A BURIED INSULATING LAYER HAVING ENHANCED FUNCTIONALITY

(71) Applicant: GLOBALFOUNDRIES Inc., Grand Cayman (KY)

(72) Inventors: Ralf Richter, Radebeul (DE); Jochen Willi. Poth, Moritzburg (DE); Sven Beyer, Dresden (DE); Stefan Duenkel, Dresden (DE); Sandhya Chandrashekhar, San Jose, CA (US); Zhi-Yuan Wu, Fremont, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/622,497

(22) Filed: Jun. 14, 2017

(65) Prior Publication Data
US 2018/0366484 A1 Dec. 20, 2018

(51) Int. Cl.
| H01L 27/11568 | (2017.01) |
| H01L 29/06 | (2006.01) |
| H01L 29/423 | (2006.01) |
| H01L 29/792 | (2006.01) |
| H01L 29/66 | (2006.01) |
| H01L 21/84 | (2006.01) |
| H01L 29/786 | (2006.01) |

(52) U.S. Cl.
CPC ........ *H01L 27/11568* (2013.01); *H01L 21/84* (2013.01); *H01L 29/0649* (2013.01); *H01L 29/4234* (2013.01); *H01L 29/66833* (2013.01); *H01L 29/792* (2013.01); *H01L 29/78648* (2013.01)

(58) Field of Classification Search
None
See application file for complete search history.

(56) References Cited

U.S. PATENT DOCUMENTS

| 6,054,734 | A * | 4/2000 | Aozasa | H01L 27/112 257/314 |
| 8,691,647 | B1 * | 4/2014 | Zheng | H01L 21/28273 438/257 |
| 9,905,565 | B1 * | 2/2018 | El Dirani | G11C 11/409 |
| 2004/0007734 | A1 * | 1/2004 | Kato | H01L 21/28282 257/324 |

(Continued)

OTHER PUBLICATIONS

Jacquet et al., "A 3 GHz Dual Core Processor ARM CortexTM-A9 in 28 nm UTBB FD-SOI COMOS With Ultra-Wide Voltage Range and Energy Efficiency Optimization," IEEE Journal of Solid-State Circuits, 49:812-26, Apr. 2014.

*Primary Examiner* — Eduardo A Rodela
*Assistant Examiner* — Nilufa Rahim
(74) *Attorney, Agent, or Firm* — Amerson Law Firm, PLLC

(57) ABSTRACT

In sophisticated SOI transistor elements, the buried insulating layer may be specifically engineered so as to include non-standard dielectric materials. For instance, a charge-trapping material and/or a high-k dielectric material and/or a ferroelectric material may be incorporated into the buried insulating layer. In this manner, non-volatile storage transistor elements with superior performance may be obtained and/or efficiency of a back-bias mechanism may be improved.

18 Claims, 5 Drawing Sheets

(56) References Cited

U.S. PATENT DOCUMENTS

| | | | |
|---|---|---|---|
| 2006/0284236 A1* | 12/2006 | Bhattacharyya | B82Y 10/00 257/314 |
| 2008/0237695 A1* | 10/2008 | Shino | G11C 11/404 257/324 |
| 2013/0001665 A1* | 1/2013 | Zhu | H01L 21/2652 257/314 |
| 2017/0004873 A1* | 1/2017 | Cai | H01L 21/84 |

* cited by examiner

TRANSISTOR ELEMENT INCLUDING A BURIED INSULATING LAYER HAVING ENHANCED FUNCTIONALITY

BACKGROUND

1. Field of the Disclosure

Generally, the present disclosure relates to semiconductor devices, including transistor elements, formed on the basis of an SOI (semiconductor-on-insulator) architecture, i.e., including a buried insulating layer.

2. Description of the Related Art

Significant progress has been made in the field of semiconductor devices regarding small signal processing, as well as power applications. In particular, the on-going scaling of critical dimensions of semiconductor devices has contributed to remarkable achievements with respect to overall complexity of analog and digital circuitry, such as micro controllers, CPUs, GPUs and the like, wherein, in highly complex microprocessors, up to several hundred million or even over a billion individual transistor elements may be implemented so as to form one or more complex circuits. In addition to steadily reducing the critical dimensions of the transistor elements, which represent the backbone of any complex circuitry, various other aspects have been taken into consideration in order to promote superior performance. For example, when striving to further enhance certain aspects of circuit performance, such as signal processing speed, power consumption, information density, processability and the like, different approaches may be taken so as to comply with these various aspects. For example, when steadily reducing critical dimensions of field effect transistors, such as the gate length, currently being on the order of magnitude of 30 nm and even less in sophisticated small signal applications, certain measures may have to be implemented in order to counter various negative effects accompanying the reduced gate length. In this respect, reduced channel control for short gate lengths, variations of dopant concentration in channel regions and the like may represent some of these adverse effects that may have to be countered so as to fully exploit the advantages associated with a reduced gate length. Similarly, in particular with respect to reduced overall power consumption, static and dynamic leakage currents may also increasingly contribute to a transistor behavior that is less than desired.

In view of some of these side effects of the reduction of critical transistor dimensions, certain approaches have been taken and have resulted in even further advanced complex integrated circuits, wherein, however, each of these various approaches may, nevertheless, result in certain drawbacks while achieving superior results in other aspects regarding the above-identified side effects. For example three-dimensional transistor architectures have been developed so as to provide superior channel control and increased current drive capability without unduly affecting or even further reducing overall transistor dimensions. On the other hand, such approaches may significantly contribute to overall process complexity, thereby rendering these approaches less than desirable for applications requiring low cost at high circuit complexity.

In other approaches, the well-established planar transistor configuration may be used in highly complex circuit designs with gate lengths in the above-identified range, wherein a so-called "SOI" (silicon- or semiconductor-on-insulator) configuration is frequently applied in an attempt to further enhance overall performance and extend applicability of the planar architecture even for further reduced transistor dimensions. Generally, an SOI architecture may be advantageous with respect to a reduced overall parasitic capacitance of the semiconductor body of the transistor, since the semiconductor region, having incorporated therein the drain and source region and the channel region, is delineated in the vertical direction, i.e., along the depth direction, by a buried insulating material, thereby generally reducing the transistor size along the vertical direction compared to a bulk configuration. Furthermore, in recent developments, the thickness of the basis semiconductor material of an SOI transistor is significantly reduced, for instance, to 15 nm and significantly less, in order to obtain a substantially fully depleted transistor configuration, thereby contributing to superior overall channel controllability. Moreover, the dopant concentration in the area of the channel region may be significantly reduced or the channel region may be provided in the form of a substantially non-doped material, thereby contributing to significantly reduced performance variations, which may be typically attributed to unavoidable dopant concentration fluctuations in transistor devices requiring a significant channel doping.

Moreover, with respect to channel controllability, which may be significantly enhanced by employing a three-dimensional transistor architecture, it has been recognized that, also in the planar transistor configuration, controllability of the channel region may be enhanced by providing a configuration that allows the application of a "bias" voltage applied to a semiconductor region that is capacitively coupled to the channel regions of the transistor under consideration. It appears that, in particular, transistor elements formed on the concept of an SOI architecture are particularly suited for applying a back-bias voltage, since the channel region is electrically isolated from the underlying bulk material, which may be efficiently used as an electrode material for applying the back-bias voltage. Since the fully depleted SOI transistor architecture intrinsically exhibits a superior channel controllability, the concept of applying a back-bias voltage contributes even further to the overall performance of these types of transistors. As fully depleted SOI transistors provide superior performance with respect to channel controllability that may be comparable to complex three-dimensional transistor architectures, and since these fully depleted SOI transistors may be advantageous with respect to reducing overall process complexity in the manufacturing process, significant efforts have been undertaken in order to exploit the concept of a back-bias voltage for enhancing overall transistor performance. To this end, voltage generators and control circuitry have been implemented into the overall circuit design so as to provide the required voltages at the "back side" of the channel regions of respective transistor elements. That is, in order to obtain an additional control function for the channel region similar to a dual gate concept, a specific bias voltage, typically a plurality of different bias voltages, has to be provided by appropriately designed voltage generators and applied at specific transistor elements, thereby also typically requiring a certain control regime, in particular, when a dynamic back-bias mechanism is to be used.

That is, although a voltage of specific magnitude may be typically permanently applied to specific transistor elements to be controlled on the basis of a back-bias voltage, in view of overall power consumption and, thus, in view of reducing leakage currents, it may be required to dynamically apply the back-bias voltage at those operating times in which the back-bias voltage control mechanism is actually required, while, in other inactive periods of the respective transistor, the back-bias voltage may be removed. Although this control strategy may provide superior controllability of the respective transistor elements while still maintaining overall power consumption, for instance, in the form of leakage currents at a low level, it turns out that significant design efforts are required and that the overall dynamic behavior of any such transistor element is reduced. That is, upon activating a transistor requiring a back-bias voltage, a certain settling time may be required prior to actually applying the signal to the actual gate electrode in order to switch the transistor as required by the input signal. Moreover, when different magnitudes of the back-bias voltage are necessary in view of the circuit design under consideration, even for a static application of different back-bias voltages, a corresponding design overhead regarding respective reference voltage has to be implemented, thereby contributing to overall design complexity and reduced circuit density for a given functional behavior of the circuitry under consideration.

Furthermore, the effect of the back-bias voltage may also be strongly influenced by the overall transistor configuration, such as the degree of depletion of the channel region, the thickness of the buried insulating layer, the gate length and the like. These aspects may also have to be taken into consideration when appropriately designing a back-bias mechanism in sophisticated SOI transistors.

Typically, upon further reducing the critical transistor dimensions, the thickness of the buried insulating layer is also reduced, which may also result in respective problems with respect to leakage currents and the like, thereby possibly reducing some of the advantages typically associated with the implementation of a back-bias mechanism.

In view of the situation described above, the present disclosure, therefore, relates to semiconductor devices and, in particular, to transistor elements, in which performance of sophisticated SOI-based transistor architectures may be enhanced by additionally controlling channel conductivity from the "back" of the transistor element, while avoiding, or at least reducing, the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that the behavior and/or functionality of SOI-based transistor elements may be extended by implementing a channel conductivity control mechanism on the basis of one or more buried insulating materials, which may be engineered so as to improve overall controllability of the channel region and/or generally extend the functionality of a specific transistor element. To this end, in some aspects of the present disclosure, the buried insulating layer may be replaced by a stack of two or more material layers of different characteristics in order to obtain the desired overall functional behavior. For instance, in some illustrative embodiments, a charge-trapping mechanism may be implemented within the buried insulating layer or layer stack, which may, therefore, be used for engineering the back-bias behavior of the buried insulating layer stack on the basis of charges that may be trapped or removed by the charge-trapping mechanism. In this manner, a non-volatile, yet programmable, mechanism may be provided so as to influence the channel conductivity, thereby obtaining various concepts for the operation of a transistor element, including the charge-trapping mechanism based on the buried insulating layer stack. For instance, in some illustrative embodiments, the charge-trapping mechanism may be considered as a non-volatile memory cell of the transistor and may, if considered appropriate, be used as a storage transistor for storing information, so that the operation of programming the memory cell and the operation of reading out the stored information bit may be accomplished on the basis of different mechanisms, thereby contributing to superior overall performance. Thereby, certain damages which may be conventionally caused in non-volatile storage transistors based on a charge-trapping mechanism implemented in the gate electrode structure may be avoided. On the other hand, when considering the transistor, including the charge-trapping mechanism on the basis of the modified buried insulating layer or layer stack, as a transistor element operated on the basis of a back-bias mechanism, the respective back-bias "voltage" may be readily implemented in a desired "magnitude" by placing a specific amount of charge within the buried insulating layer so as to obtain an "instant" back-bias voltage upon activating the respective standard gate electrode structure. Consequently, by using one or more programming voltages, a desired range of back-bias "voltages" may be implemented in a circuit, which may be accomplished in a final phase of the overall manufacturing process, or which may even be accomplished in a dynamic manner during any operation period of the circuit under consideration.

In other aspects of the present disclosure, the engineering of the buried insulating materials may be accomplished by applying techniques for implementing a high-k dielectric material, which provides a desired physical thickness, while at the same time reduces the corresponding oxide equivalent thickness of the resulting buried insulating material. In this manner, the capacitive coupling to the channel region may be increased, while at the same time, static and dynamic leakage currents through the buried insulating stack may be reduced. Furthermore, when scaling transistor elements, thereby also requiring a respective scaling of the equivalent oxide thickness, the incorporation of additional charge carriers into a physically thick buried insulating material based on a high-k dielectric material may have a significantly reduced effect on the overall transistor performance compared to a respectively scaled physical thickness of a standard silicon dioxide-based material of a buried insulating layer.

In still other aspects of the present disclosure, the engineering of the buried insulating layer or layer stack may include the incorporation of a ferroelectric material, which may be used for appropriately affecting the channel conductivity in a desired manner. That is, also in this case, this mechanism may be considered as a non-volatile memory cell or memory portion of the transistor under consideration, wherein the operation of programming and the operation of reading out the stored information may be locally separated from each other, as also discussed above in the context of the charge-trapping mechanism. That is, the voltage required for establishing a specific polarization state may be applied without requiring a high voltage difference between the actual gate electrode structure and the respective drain and source regions, thereby substantially avoiding any adverse effects on the actual gate electrode structure. In other aspects, as also discussed above, the ferroelectric material within the buried insulating layer or layer stack may be appropriately engineered, for instance, with respect to crystallographic configuration, thickness and the like, so as to achieve different magnitudes of electric fields within the channel region, thereby also obtaining different back-bias "voltages" in a non-volatile manner, while preserving the basic transistor configuration.

In one illustrative embodiment disclosed herein, a transistor element includes a channel region formed in a semiconductor layer, laterally positioned between a drain region and a source region. The transistor element further includes a control gate electrode structure formed on the channel region. Additionally, the transistor element includes a buried insulating layer stack formed below the semiconductor layer and comprising at least two different dielectric material layers. Furthermore, the transistor element includes a semiconductor body region formed below the buried insulating layer stack, connected to receive a control voltage.

In a further illustrative embodiment disclosed herein, a transistor element includes a channel region that is formed in a semiconductor layer and that is laterally positioned between a drain region and a source region. Furthermore, the transistor element includes a control gate electrode structure formed on the channel region. Additionally, a buried insulating layer is formed below the semiconductor layer and comprises a charge-trapping layer. Moreover, the transistor element includes a semiconductor body region formed below the buried insulating layer, connected to receive a control voltage.

In still a further illustrative embodiment disclosed herein, a transistor element includes a channel region that is formed in a semiconductor layer and that is laterally positioned between a drain region and a source region. Moreover, a control gate electrode structure is formed on the channel region. Furthermore, a buried insulating layer is formed below the semiconductor layer and comprises a high-k dielectric material. Additionally, the transistor element includes a semiconductor body region that is formed below the buried insulating layer and that is connected so as to receive a control voltage.

BRIEF DESCRIPTION OF THE DRAWINGS

The disclosure may be understood by reference to the following description taken in conjunction with the accompanying drawings, in which like reference numerals identify like elements, and in which.

Figure 1A:
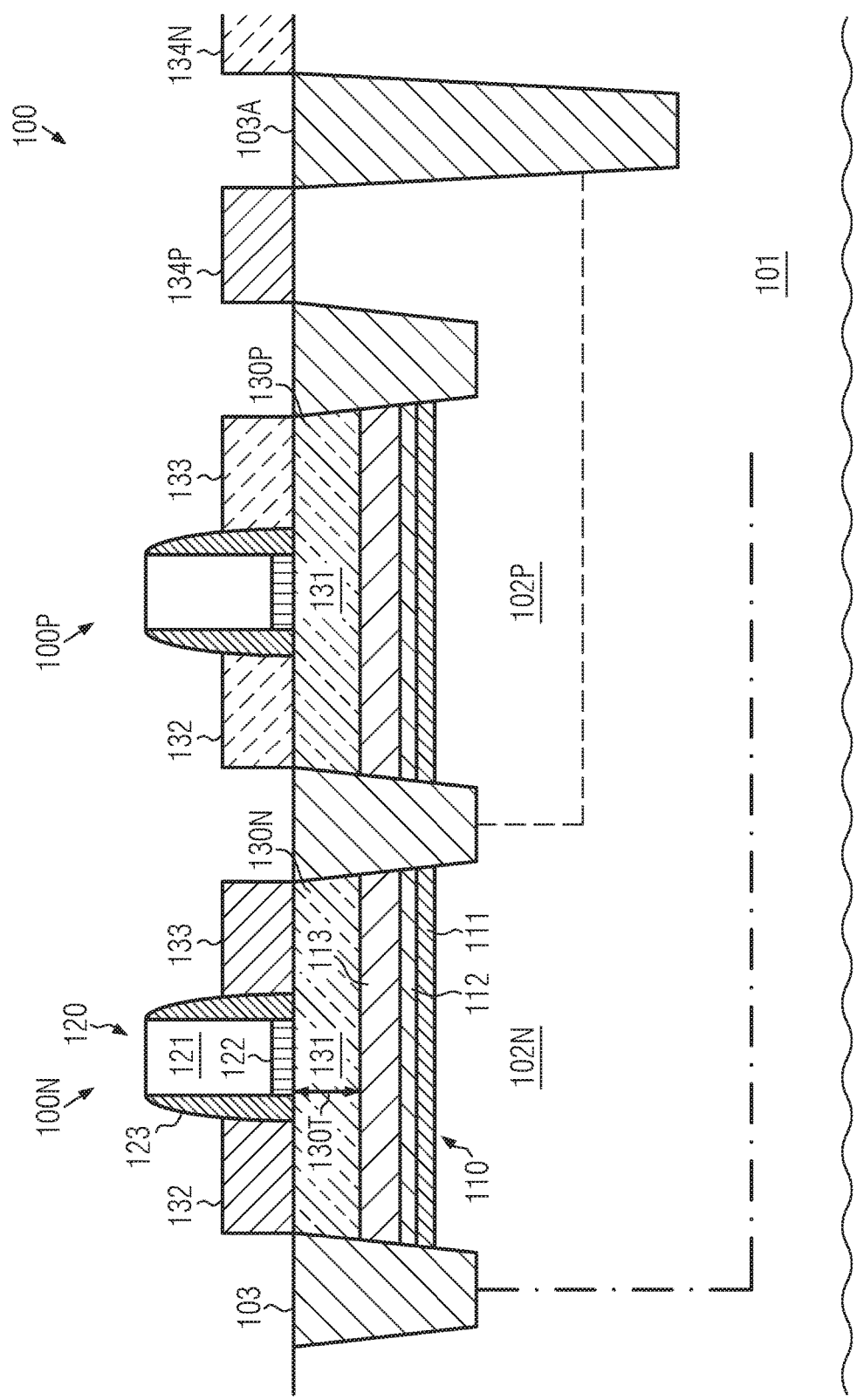
FIG. 1A schematically illustrates a cross-sectional view of a semiconductor device, including one or more transistor elements formed on the basis of an SOI architecture, including a buried insulating layer of specifically engineered characteristics so as to enhance or extend functionality of the transistor elements, wherein, in the embodiments shown in this figure, a charge-trapping material is incorporated in the buried insulating layer.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As already discussed briefly above, the present disclosure is generally based on the concept that performance and/or functionality of SOI-based transistor elements may be extended by engineering the buried insulating layer, which is conventionally provided on the basis of a single silicon dioxide layer. As already set forth above, the SOI architecture may generally provide significant advantages, such as reduced parasitic capacitance and the like, wherein, in particular, the capability of allowing an efficient additional control of the channel conductivity by means of a back-bias mechanism offers additional opportunities for enhancing overall transistor performance. According to the principles disclosed herein, a buried insulating layer may be provided, in some illustrative embodiments, in the form of a buried insulating layer stack, in which at least two different materials may be provided so as to obtain enhanced performance and/or functionality. For instance, the incorporation of a charge-trapping mechanism into the buried insulating layer or layer stack provides the possibility of implementing a non-volatile memory portion in a single transistor element, without changing the overall transistor dimensions. The memory portion of the transistor element under consideration may then be used, in some illustrative embodiments, as a memory cell for storing one or more bits of information, wherein the charge-trapping mechanism in the buried insulating layer provides a decoupling of write and read operations, since the read operations may be performed on the basis of the standard gate electrode structure, while the write operations, i.e., programming and erasing operations, may be performed on the basis of the charge-trapping mechanism based on the buried insulating layer. In this manner, typical negative aspects associated with the incorporation of charge-trapping materials into the standard gate electrode structure, typically used in conventional strategies, may be substantially avoided, since any high voltages typically required for programming, i.e., injecting charges into and removing charges out of the charge-trapping material, may not affect the gate electrode structure, thereby contributing to a reduced complexity of the gate electrode structure and additionally increasing overall reliability thereof.

In other illustrative embodiments, the transistor element may be considered as a standard logic element or, if required, as an analog field effect transistor, wherein the channel conductivity may be adjusted, in addition to the standard control mechanism provided by the gate electrode structure, by the charge trapped in the charge-trapping material, thereby obtaining a respective electric field across or at least in the vicinity of the channel region, which may correspond to the electric field caused by a back-bias voltage as used in conventional sophisticated SOI transistor elements. Contrary to these conventionally applied back-bias voltages, as also discussed briefly above, the electric field obtained by the trapped charge carriers may be considered as an "instant" back-bias voltage, since it is present in the channel region, irrespective of the state of the actual control gate electrode structure. Consequently, upon applying a signal to the gate electrode structure, the back-bias "voltage," according to the principles discussed herein, is instantly effective, so that respective settling times and control strategies for appropriately timing the generation of a back-bias voltage and applying a signal to the gate electrode structure may no longer be required.

Furthermore, since the respective trapped charge carriers may typically have a retention time of at least 10 years or even significantly longer, the corresponding back-bias "voltages" obtained by the trapped charge carriers may be considered as non-volatile and permanent back-bias voltages, thereby also rendering respective voltage generators obsolete when a dynamic control of the back-bias voltage is not required. For instance, in such cases, respective control voltages, i.e., programming voltages, may be applied during a final phase of the manufacturing process, for instance, during electrical testing, burn-in and the like, so as to establish respective back-bias mechanisms for respective transistor elements. It should be appreciated that any such programming operations may also be performed during use of the semiconductor device under consideration, as long as a respective contact regime may be accessible from the outside, for instance, on the basis of peripheral circuitry, if dynamic operation of the back-bias mechanism is necessary.

In other illustrative embodiments, one or more voltage generators, such as charge pumps and the like, may be provided in combination with corresponding control circuitry within the semiconductor device under consideration, thereby enabling implementation of a dynamic back-bias mechanism, since appropriate programming or control voltages for injecting and/or removing charge carriers into/from the charge-trapping material may be accomplished on the basis of chip-internal mechanisms. Although the advantage of avoiding significant overhead with respect to conventional voltage generators and the respective control regime in applying actual voltages across the buried insulating layer of conventional transistor elements may be less pronounced, it appears, nevertheless, that a significant improvement with respect to the dynamic behavior may be achieved, since any settling times due to the non-volatile nature of the mechanism based on the charge-trapping material included in the buried insulating layer may still be avoided. Consequently, at least design efforts and software overhead regarding appropriate timing of conventional back-biased SOI transistors may be significantly reduced.

In other illustrative embodiments disclosed herein, transistor behavior may be significantly improved by incorporating a high-k dielectric material into the buried insulating layer, so that appropriate bandgap engineering of the buried insulating layer may result in superior control of the channel region, thereby also providing the possibility of further scaling the transistor dimensions and, in particular, the oxide equivalent thickness of the buried insulating material. That is, upon implementing a high-k dielectric material, which is to be understood as a dielectric material having a permittivity of 20 and even higher, a significantly increased capacitive coupling to the channel region may be accomplished, compared to the standard dielectric material based on silicon dioxide, as is used in conventional SOI-based transistor elements. In this manner, a true dual gate control regime may be established, in particular, in fully depleted SOI transistor elements, in which a thickness of the semiconductor layer of the channel region has a thickness of approximately 15 nm and significantly less. On the other hand, the physical thickness of the buried insulating material may be preserved or adjusted to a desired value, thereby obtaining superior performance with respect to leakage currents in highly scaled transistor elements. Consequently, based on a given transistor design, the engineering of the buried insulating layer may be efficiently implemented into the overall process flow with full compatibility with existing process strategies for forming the transistor components. In particular, the engineering of the buried insulating layer may be accomplished on the basis of processes and materials which are also typically used in forming sophisticated high-k metal gate electric structures. Therefore, superior overall performance may be accomplished without requiring any design modifications and, in particular, without consuming additional area in an integrated circuit chip.

In further illustrative embodiments disclosed herein, the engineering of the buried insulating layer may include incorporation of a ferroelectric material so as to allow the establishment of a polarization state in this material appropriate for affecting the channel conductivity, as discussed above. In some illustrative embodiments, the engineering may include incorporation of the ferroelectric material with different thicknesses and/or material characteristics so as to provide different electrical fields, thereby achieving different magnitudes of non-volatile back-bias "voltages" so as to comply with different requirements for different transistor elements. In other illustrative embodiments, a non-volatile memory cell may be formed on the basis of the ferroelectric material, wherein, in this case, a decoupling of write and read operations may also be accomplished. Also in this case, as already discussed above, a significant relaxation of stress during operation of the standard gate electrode structure may be achieved, since any high voltages for programming or erasing the memory cell may be avoided at the gate electrode structure. In some illustrative embodiments, the ferroelectric material may be incorporated in the form of a layer stack, wherein at least a conventional dielectric material, such as silicon dioxide, may be provided as a final layer so as to provide a high degree of compatibility with conventional silicon dioxide-based buried insulating layers.

FIG. 1A schematically illustrates a cross-sectional view of a semiconductor device 100, which may include one or more transistor elements formed on the basis of an appropriately engineered buried insulating layer or layer stack. In the embodiments shown in the context of FIG. 1A, for convenience, two transistor elements 100N and 100P are illustrated, which may represent any appropriate transistor elements required for the semiconductor device 100. For example, the transistor element 100N may represent an N-type transistor element, while the transistor element 100P may represent a P-type transistor element in some illustrative embodiments, while, in other cases, the transistor elements 100N, 100P may represent transistors of the same conductivity type, however, differing in certain characteristics, such as transistor dimensions, operating voltage and, thus, gate dielectric thickness, and the like. Furthermore, it should be appreciated that the transistor elements 100N, 100P are illustrated as adjacent transistor elements separated by an isolation structure 103, such as a shallow trench isolation, while, in other cases, the transistor elements 100N, 100P may be provided at very different device regions of the semiconductor device 100.

The transistor elements 100N, 100P are illustrated in a moderately advanced manufacturing stage in which a control gate electrode structure 120 may be formed above a respective semiconductor layer. For convenience, respective semiconductor layers for the transistor elements 100N, 100P may be indicated as semiconductor layers 130N, 130P, wherein, depending on the overall requirements, these semiconductor layers may differ in material composition and/or dopant concentration and/or thickness and the like. For example, the semiconductor layers 130N, 130P may have incorporated therein, for instance, at certain portions, semiconductor alloys, such as silicon/germanium, silicon/carbon and the like, depending on the requirements with respect to performance and/or functionality of the transistor elements 100N, 100P. The semiconductor layers 130N, 130P may include source and drain regions 132, 133, which typically represent areas of increased dopant concentration and, thus, conductivity, compared to a channel region 131, which is typically positioned below the gate electrode structure 120 and is, therefore, laterally enclosed by the source and drain regions 132, 133. It should be appreciated that, in some illustrative embodiments, as, for instance, shown in FIG. 1A, the source and drain regions 132, 133 may be provided in the form of so-called "raised" source and drain regions in which a highly doped semiconductor material is formed so as to extend along a height direction, i.e., in FIG. 1A, the vertical direction, in order to provide contact areas on the upper end, while connecting to the channel region 131 at the lower ends of the drain and source regions 133, 132. Typically, the additional portions of the raised source and drain regions 132, 133 may represent in situ doped semiconductor materials formed on or within the semiconductor layers 130N, 130P. It should be appreciated that the raised source and drain regions 132, 133 of the transistor element 100P may be of opposite conductivity type with respect to the transistor element 100N, if these transistors represent complementary transistor elements.

Irrespective of the specific configuration of the source and drain regions 132, 133, a thickness of the semiconductor layers 130N, 130P may be defined so as to correspond to a thickness, i.e., an extension along the height direction 130T at or within the area of the gate electrode structure 120. As discussed above, in sophisticated applications, the thickness 130T of the semiconductor layers 130N, 130P may be selected so as to be in a range of 15 nm and significantly less, such as 10 nm and even less. In this case, the transistor elements 100N, 100P may be considered as fully depleted transistor elements, wherein the dopant concentration in the respective channel regions 131 may be moderately low or may represent a substantially non-doped semiconductor region.

Moreover, a "length" of the channel regions 131 may be substantially determined by a "length" of the gate electrode structure 120, wherein a respective electrically effective length, i.e., a length extending along the horizontal direction in FIG. 1A, may be substantially determined by a corresponding dimension of an electrode material 121 and a gate dielectric layer 122 of the gate electrode structure 120. It should be appreciated that, in sophisticated applications, a corresponding gate length may be 30 nm and significantly less, while, in other cases, a greater gate length may be applied if compatible with the overall circuit design under consideration. Depending on the sophistication of the transistor elements 100N and/or 100P, the gate dielectric material 122 may be provided in the form of a high-k dielectric material, possibly in combination with a standard dielectric material of reduced thickness, such as silicon dioxide, silicon oxynitride, silicon nitride and the like. High-k dielectric materials, such as hafnium-based dielectric materials, are well established in the semiconductor industry and may be used for forming a dielectric material having a permittivity of 20 and significantly higher, depending on the overall requirements.

Furthermore, the dielectric layer 122 may have incorporated therein any appropriate species, such as metal species and the like, so as to adjust overall bandgap characteristics, as is also well known in the art. Similarly, the electrode material 121 may be formed on the basis of well-established semiconductor materials, such as polysilicon, amorphous germanium, silicon/germanium and the like, including appropriate dopant species, while, in other cases, in addition to or alternatively, metal-containing materials of increased conductivity may be used. It should further be appreciated that the electrode material 121, as well as the source and drain regions 132, 133, may include a metal-containing semiconductor compound, such as nickel silicide and the like, in order to generally reduce contact resistance of these areas. In other cases, any such contact areas of increased conductivity may be formed in a later manufacturing stage.

The transistor elements 100N, 100P may further comprise a buried insulating layer 110, which may, in some illustrative embodiments, be provided in the form of a layer stack, which is indicated for convenience by the same reference numeral 110. As discussed above, the buried insulating layer stack 110 may be provided so as to exhibit enhanced functionality and/or performance by incorporating one or more materials of different characteristics compared to conventional dielectric materials that are used in conventional SOI-based transistor elements, such as silicon dioxide and silicon nitride. In the embodiment shown in FIG. 1A, the buried insulating layer stack 110 may comprise a charge-trapping layer 112, which is to be understood as a material that is able to trap charge carriers, such as electrons and/or holes, with sufficient efficiency and to hold these trapped charges over an extended period of time, such as 10 years and even longer, as is, for instance, known in non-volatile storage transistors including a charge-trapping material in the respective gate electrode structures. For instance, silicon nitride, hafnium enriched silicon oxynitride and the like are well-known charge-trapping materials, which may also be efficiently used in the charge-trapping layer 112. The charge trapping layer 112 may be provided in the form of a layer having a thickness of approximately 1 nm to several 10 s of nm, depending on the overall device configuration.

In some illustrative embodiments, the buried insulating layer stack 110 may further comprise a further dielectric layer 111, which may provide for a separation of the charge-trapping layer 112 with respect to an underlying semiconductor region 102N, 102P, which may also be referred to as a semiconductor "body" region or bulk region, which may be used as an electrode material for applying an appropriate control voltage for injecting/removing charge carriers into/from the charge-trapping layer 112, as will be discussed later on in more detail. For example, the dielectric layer 111 may be considered as a tunnel dielectric layer, such as an oxide layer, which may allow the passing through, i.e., the tunneling of charge carriers. To this end, an appropriate thickness and density of the oxide material in the layer 111 may be selected as is, for instance, also known from respective ONO layer stacks of conventional storage transistors, including a charge-trapping mechanism on the basis of an oxide-nitride-oxide layer stack. Similarly, a further dielectric layer 113, which may also be described as a blocking layer, may be provided so as to separate the charge-trapping layer 112 from the semiconductor layers 130N, 130P. The blocking dielectric layer 113 may be formed on the basis of any appropriate material, such as silicon dioxide and the like, and may have appropriate density and thickness so as to substantially suppress the passing through of charge carriers from and into the respective semiconductor layers 130N, 130P. For instance, a thickness of the tunneling dielectric layer 112 may be in the range of 1 to several nm, while a thickness of the blocking dielectric layer 113 may be in the range of several nm to several 10 nm, depending on the overall requirements.

It should be appreciated that the buried insulating layer or layer stack 110 separates the semiconductor layer and, in particular, the channel region 131, from the underlying semiconductor body region, i.e., the body region 102N for the transistor 100N and a semiconductor body region 102P for the transistor element 100P. The semiconductor body regions 102N, 102P may represent doped regions, which, depending on the type of charge carriers to be trapped in the respective charge-trapping layers 112, may have a P-doping or an N-doping and may typically form a PN junction with each other for respective electrical isolation of the regions 102N, 102P. The regions 102N, 102P may, therefore, represent upper portions of a substrate material 101, such as a silicon material, a geranium material and the like, that are appropriately doped. For example, in some illustrative embodiments, the semiconductor body region 102N may be provided in the form of a P-type semiconductor material, when, for instance, the transistor element 100N may represent an N-type transistor. Similarly, the semiconductor body region 102P may represent an N-type semiconductor material, when, for instance, the transistor element 100P may represent a P-type transistor. It should be appreciated, however, that any other configuration may be selected, depending on the required type of charge carrier to be trapped in the respective charge-trapping layers 112.

Furthermore, in the embodiment shown in FIG. 1A, the semiconductor body region 102P may connect to a highly doped semiconductor region 134P, which may represent a highly doped semiconductor material of similar or identical configuration compared to the raised drain and source regions 133, 132, possibly in combination with an additional metal-containing semiconductor compound, such as nickel silicide and the like (not shown) so as to reduce contact resistance for connecting to the semiconductor body region 102P. Similarly, the semiconductor body region 102N may connect to a highly doped semiconductor region 134N, so as to reduce overall contact resistance to the semiconductor body region 102N. Also in this case, the region 134N may have a configuration similar to the raised drain and source regions 133, 132 and may have the same type of conductivity as the semiconductor body region 102N. Also, a highly conductive metal-containing semiconductor compound may be incorporated in the region 134N or may be formed in a later manufacturing stage. Moreover, typically the respective areas of the semiconductor body regions 102N, 102P may be separated by an isolation structure 103A, which may extend more deeply into the substrate 101 compared to the isolation structures 103, thereby providing superior performance, since at least a significant portion of the regions 102N, 102P may be electrically isolated by the structure 103A rather than by a PN junction.

The semiconductor device 100 as shown in FIG. 1A may be formed on the basis of the following processes. The substrate 101 may, in some illustrative embodiments, be provided in the form of an SOI substrate having formed thereon, at least in certain device regions, the buried insulating region stack 110, which may, therefore, be formed on a specific carrier material by deposition and/or oxidation techniques, for instance, for forming the tunnel dielectric layer 111, followed by the charge-trapping layer 112 and the blocking dielectric layer 113. To this end, any well-established process techniques may be applied, as are well known in the art of forming flash memory elements in the form of storage transistors. In other cases, respective device regions may be masked, for instance, for maintaining a conventional buried insulating material, such as silicon dioxide, while any non-masked regions may be processed so as to remove or at least reduce the thickness of the corresponding silicon dioxide-based material and form the charge-trapping layer 112 and the blocking dielectric layer 113, wherein a subsequent planarization process, if required, may provide a planar surface typography, which may then be used for bonding a specific donator substrate so as to form an initial version of the semiconductor layers 130N, 130P.

Thereafter, the processing may be continued on the basis of well-established process strategies, for instance, by forming the isolation structures 103, 103A on the basis of well-established process techniques, such as masking processes, etch processes, deposition and oxidation processes, thereby obtaining the structures 103, 103A with desired material composition and geometry. Prior to and/or after forming the isolation structures 103, 103A, the semiconductor body regions 102N, 102P may be formed, for instance, by ion implantation techniques in combination with respective masking strategies, wherein any such processes may be performed in the context of providing well regions for other transistors and also forming the respective connection for applying respective control voltages to the regions 102N, 102P. It should be appreciated that, in some cases, respective semiconductor body regions may be electrically connected to a single or only a few contact regions, when substantially the same control voltage may have to be applied to a respective number of transistor elements. In the embodiments shown in FIG. 1A, the semiconductor body regions 102N, 102P may be individually connected to an appropriate control voltage.

Next, the gate electrode structures 120 may be formed on the basis of well-established process techniques requiring sophisticated lithography and patterning sequences in combination with respective material deposition techniques for forming the dielectric layers 122 and one or more of the gate electrode materials 121. If required, respective sidewall spacer structures 123 may be formed after patterning the gate electrode material 121 and the gate dielectric layer 122. As discussed above, the process flow for forming a gate electrode structure 120 may also include the incorporation of a high-k dielectric material in the dielectric layer 122 in combination with appropriate threshold adjusting species, if required, and appropriate metal-containing layers may be incorporated in the material 121, possibly in combination with metal-containing electrode materials.

Next, the raised drain and source regions 133, 132 may be formed on the basis of respective masked epitaxial growth techniques, wherein an appropriate high dopant concentration may be provided in situ, while, in other cases, any other technique may be applied, for instance, ion implantation and the like, so as to form the drain and source regions 133, 132 in compliance with the overall device requirements. It should be appreciated that any additional implantation processes may also be performed so as to obtain a desired dopant profile in other portions of the semiconductor layers 130N, 130P, if required. Additionally, during the entire process flow, respective anneal processes may be applied as required for implementing appropriate material characteristics, such as activation of dopants, adjusting material characteristics of high-k dielectric materials and the like.

The further processing may be continued by forming respective metal semiconductor compounds, if required, followed by providing a dielectric material (not shown) which may receive respective contact openings so as to connect to the source and drain regions 132, 133, the gate electrode structures 120 and the contact regions 134P, 134N. Thereafter, an appropriate metallization structure (not shown) may be formed on the basis of well-established process strategies.

Upon operating the semiconductor device 100 as shown in FIG. 1A, the transistors 100N, 100P may be considered as non-volatile memory transistors, wherein the buried insulating layer stack 110 in combination with the semiconductor body regions 102N, 102P and the respective semiconductor layers 130N, 130P may be considered as a memory cell.

On the other hand, the gate electrode structure 120, the drain and source regions 133, 132 and the semiconductor layers 130N, 130P may be considered as the actual transistor portion responding to a logic signal applied to the gate electrode structure 120. For instance, by connecting drain and source and the gate electrode 133, 132, 120 to an appropriate reference voltage and applying a corresponding control voltage at the contact region 134P that is of sufficient magnitude, charge carriers may be preferably injected into or removed from the charge-trapping layer 112 due to the asymmetric configuration in the height direction of the layer stack 110. For instance, when the region 102N is provided as a P-type semiconductor region, a corresponding control voltage may result in the injection of holes into the charge-trapping layer 112, while a reverse control voltage may result in the removal of previously trapped charge carriers. In some illustrative embodiments, the respective control voltage may be applied so as to obtain sufficient charge in the charge-trapping layer 112 so as to provide two significantly different threshold voltages for the respective transistor elements 100N, 100P, which may, thus, provide an efficient non-volatile memory cell. As discussed above, in this case, the read operation may then be accomplished on the basis of providing a logic signal to the gate electrode 120 on the basis of the standard operating voltage, while, on the other hand, the programming operation, i.e., the write operation, may be accomplished on the basis of the buried insulating layer stack 110 without substantially affecting the gate electrode structure.

In other cases, duration and/or magnitude of the control voltage may be controlled so as to have a certain amount of charge carriers in the charge-trapping layer 112 in order to establish a desired back-bias "voltage," i.e., a respective non-volatile electric field across the semiconductor layers 130N, 130P, respectively, thereby enabling adjustment of different operating conditions. Thus, also in this case, the respective transistor elements 100N, 100P may be operated on the basis of appropriate back-bias fields, which are available instantly and which are provided in a permanent manner, thereby offering the advantages of superior channel controllability, without requiring any sophisticated timing control as is typically necessary in conventional strategies in which the back-bias voltage may have to be provided in timed relationship to the application of a logic signal to the gate electrode structure 120. Consequently, any development of algorithms for appropriately timely coordinating the applications of the back-bias voltage and the gate voltage may be avoided, or may be significantly relaxed.

It should be appreciated that the preparation of the respective charge-trapping layers 112 may be accomplished, for instance, in a permanent or "static" manner, by applying respective appropriate control voltages to the corresponding semiconductor body regions 102N, 102P during a final phase, for instance, during an electrical test, burn-in and the like, thereby permanently establishing respective transistor internal back-bias "voltages." In this case, the respective control voltages for obtaining the required charge in the charge trapping layer 112 may be supplied by external equipment, thereby merely requiring an appropriate connection regime for contacting the corresponding contact regions 134P, 134N. In other cases, when a highly dynamic programmability is desired, respective voltage sources for the one or more control voltages may be provided within the semiconductor device 100 so that the corresponding transistor internal "permanent" back-bias voltages may be reconfigured at any time of operating the device 100.

Figure 1B:
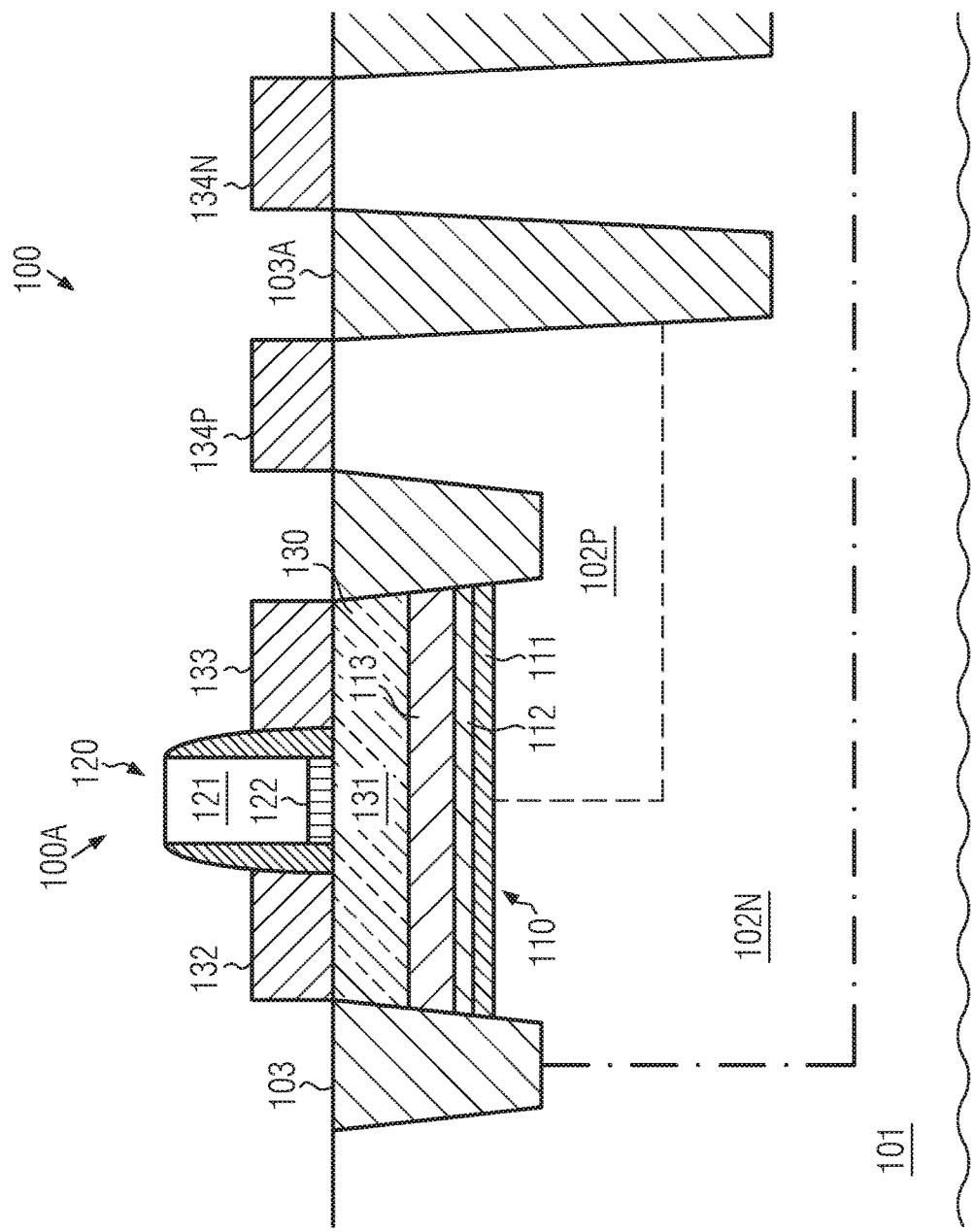
FIG. 1B schematically illustrates a cross-sectional view of a transistor element including a buried insulating layer having incorporated therein a charge-trapping layer, wherein charge carriers may be locally positioned differently in the charge trapping material within a single transistor element, according to illustrative embodiments.

FIG. 1B schematically illustrates a cross-sectional view of the semiconductor device 100 which may, in addition or alternatively to the transistor elements 100N, 100P as shown in FIG. 1A, comprise a transistor element 100A having a similar configuration as the transistor elements previously described, i.e., a semiconductor layer 130 including the channel region 131, the gate electrode structure 120 and, in particular, the buried insulating layer stack 110 including the charge-trapping layer 112. Furthermore, two different semiconductor body regions, also indicated as regions 102N, 102P, may be provided, which are appropriately connected to the respective contact regions 134P, 134N, as is also discussed above with reference to FIG. 1A. Consequently, when providing these semiconductor body regions 102N, 102P with different types of doping, different types of charge carriers may be trapped/removed in/from respective portions of the charge-trapping layer 112 by applying respective control voltages on the basis of the contact regions 134P, 134N, as is also discussed above for the semiconductor body regions 102N, 102P of the transistor elements 100N, 100P of FIG. 1A. Therefore, an increased degree of flexibility, for instance, in adjusting an appropriate permanent back-biased "voltage," may be achieved, since respective charge carriers may be positioned at two different lateral positions within the charge-trapping layer 112, thereby providing a wider range of electrical fields for influencing the overall conductivity of the channel regions 131. In other cases, when using the transistor element 100A as a memory cell for storing information therein, the bit density may be increased, due to the increased flexibility in adjusting the corresponding electric field created by the charge carriers in the charge-trapping layer 112. For example, by merely providing two different control voltages, i.e., one control voltage for programming and erasing a portion of the charge-trapping layer 112 associated with the semiconductor body region 102N, and a control voltage for programming/erasing the portion of the charge-trapping layer 112 associated with the semiconductor body region 102P, in principle, four different charge carrier distributions within the charge-trapping layer 112 and, thus, four different electric field distributions, may be achieved. In this case, the number of required control voltages and respective voltage sources may be reduced.

It should be appreciated that the transistor element 100A may be formed on the basis of basically the same techniques as described above with reference to the transistor elements 100N, 100P, wherein, however, the step of providing the semiconductor body regions 102N, 102P may be performed on the basis of a different masking regime, for instance, during respective implantation processes, so as to obtain the configuration as shown in FIG. 1B.

Figure 2:
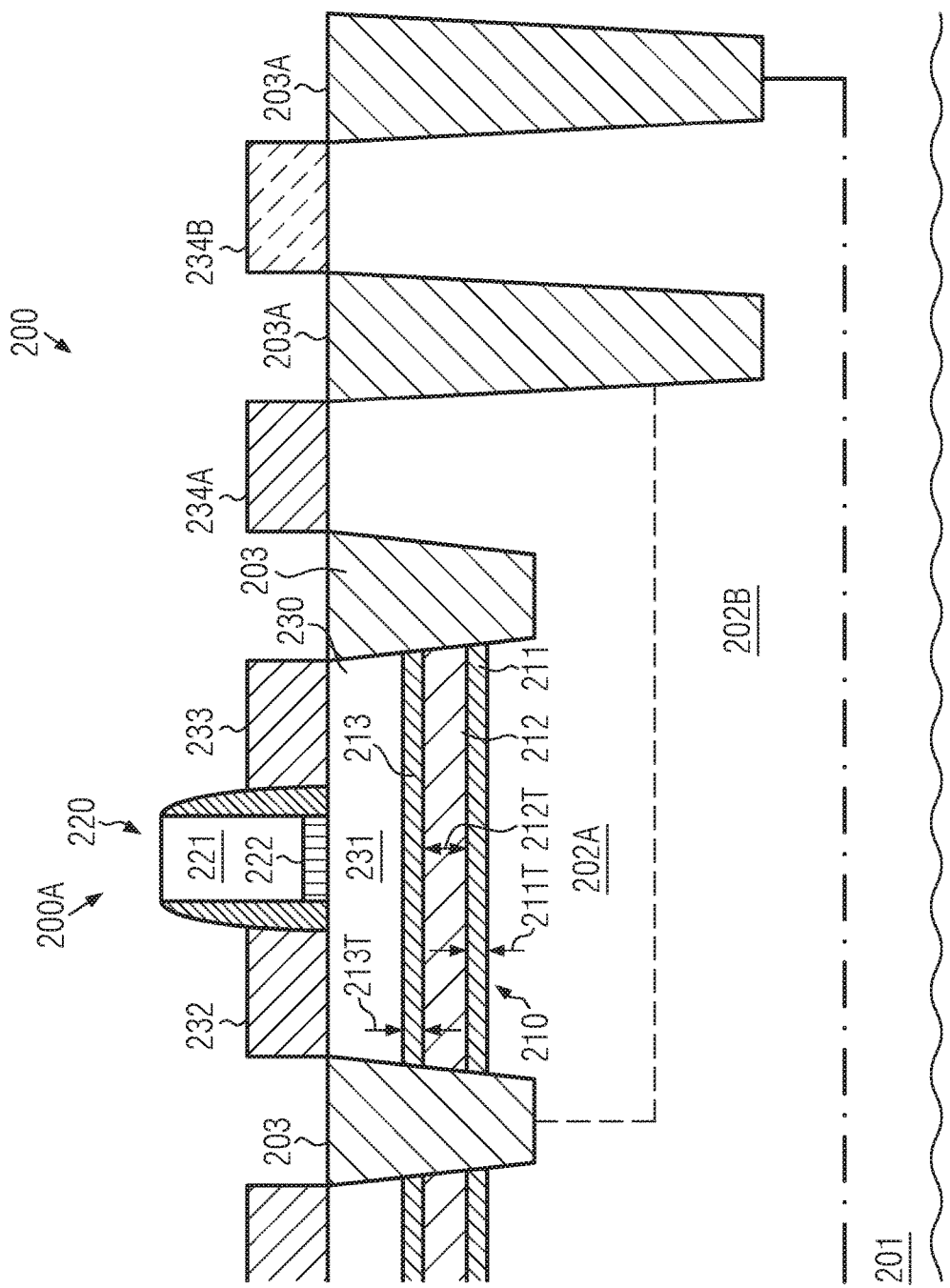
FIG. 2 schematically illustrates a cross-sectional view of a transistor element including an engineered buried insulating layer, comprising, in the embodiments shown, a high-k dielectric material.

FIG. 2 schematically illustrates a cross-sectional view of a semiconductor device 200 according to further illustrative embodiments, in which a transistor element is formed on the basis of an SOI architecture including a specifically engineered buried insulating layer or layer stack. As shown, a transistor element 200A may comprise a semiconductor layer 230 including a channel region 231 that is laterally delineated by source and drain regions 232, 233, which may be provided in the form of raised source and drain regions, as discussed above, or which may have any other appropriate configuration, depending on the overall configuration of the transistor element 200A.

In some illustrative embodiments, the semiconductor layer 230 may have a thickness of approximately 15 nm and significantly less, and may have a corresponding dopant concentration, in particular, in the channel region 231, so as to provide a fully depleted field effect transistor, as is discussed above. It should be appreciated, however, that other transistor configurations, such as a partially depleted architecture and the like, may also be employed, if the basis design of the semiconductor device 200 requires such transistor elements. Furthermore, the transistor element 200A may comprise a buried insulating layer stack 210, which may include a high-k dielectric material provided in the form of one or more layers, such as the high-k dielectric layer 212. In the embodiment illustrated in FIG. 2, the buried insulating layer or layer stack 210 may comprise the high-k dielectric material in the form of a single layer, such as the layer 212, while, in other cases (not shown), two or more high-k dielectric layers may be provided. It should be appreciated that a plurality of high-k dielectric materials are well established in the field of semiconductor manufacturing, and that any of these high-k dielectric materials may be used, wherein such materials are typically selected in view of compatibility with the overall process flow for forming the semiconductor device 200. For instance, hafnium oxide-based dielectric materials are frequently used in the context of forming sophisticated high-k metal gate electrode structures and respective materials and corresponding process strategies for forming the same may be efficiently used for forming the one or more high-k dielectric layers 212.

Furthermore, the buried insulating layer stack 210 may comprise two or more non-high-k dielectric layers, i.e., dielectric layers having a permittivity of approximately 10 and less, such as silicon nitride, silicon dioxide, silicon oxynitride and the like. In the embodiments shown, non-high-k dielectric layer 213 may be formed so as to separate the one or more high-k dielectric layers 212 from the semiconductor layer 230. Similarly, a further non-high-k dielectric layer 211 may be provided so as to separate the high-k dielectric layer 212 from an underlying semiconductor body region 202A, which may represent any appropriately doped semiconductor region required for applying a control voltage, thus establishing an electric field across the buried insulating layer stack 210 for appropriately affecting conductivity in the channel region 231.

Furthermore, a further semiconductor body region 202B may be provided so as to be positioned below any other transistor element (not shown), wherein the respective semiconductor body regions 202A, 202B may be appropriately connected to contact regions 234A, 234B, respectively, which may have a similar configuration as the drain and source regions 233, 232.

Basically, the transistor element 200A of the semiconductor device 200 may be formed on the basis of well-established process strategies in accordance with a desired design, since, as already discussed, the engineered buried insulating layer stack 210, similar to the layer stack 110 previously discussed with reference to the semiconductor device 100, may provide the possibility of using well-established transistor designs on the basis of well-established manufacturing strategies due to the high degree of compatibility with existing process flows, while, nevertheless, significantly enhancing overall performance and/or functionality of the respective transistor elements. Consequently, the transistor element 200A may be formed in accordance with similar process techniques as already described above, i.e., the body regions 202A, 202B and isolation structures 203, 203A, may be formed in accordance with well-established process techniques using an appropriate substrate material 201. Thereafter, the gate electrode structure 220 with appropriate configuration (electrode material 221 and gate dielectric layer 222) may be formed followed by the formation of the drain and source regions 233, 232 and the contact regions 234A, 234B.

It should be appreciated that the buried insulating layer stack 210 may be formed across the entire substrate 201, while, in other cases, a corresponding buried insulating layer stack may be formed locally if a "bulk" architecture is required in some other device regions, as used, for instance, for connecting to the respective body regions 202A, 202B. That is, a bulk configuration is to be understood as an area in which the buried insulating layer stack 210 is removed and a semiconductor material extends from the surface to the substrate 201. For example, the layer stack 210 may be efficiently formed on the substrate 201 as an uppermost layer stack, for instance, by forming the layer 211 by deposition and/or oxidation, followed by the deposition of one or more high-k dielectric materials and appropriate treatment thereof, if required, while, finally, the layer 213 may be provided, for instance, by deposition, thereby forming a dielectric surface that may be appropriate for performing a wafer bonding process on the basis of well-established process recipes, thereby obtaining an initial version of the semiconductor layer 230.

When preparing the layer stack 210, a desired physical thickness may be established so as to provide superior performance in terms of leakage current suppression. This may be accomplished by using a desired increased thickness of the one or more high-k dielectric layers, as illustrated by 212T, while the thickness 213T of the conventional dielectric layer 213 and the thickness 211T of the conventional dielectric layer 211 and of any other additional non-high-k dielectric layer may be selected moderately thin so as to comply with overall manufacturing requirements, while not unduly increasing the resulting the oxide equivalent thickness.

In some illustrative embodiments, a combined thickness of one or more high-k dielectric materials, indicated herein as the thickness 212T, may be greater than each individual thickness of any non-high-k dielectric material. Furthermore, in one illustrative embodiment, the combined thickness of the high-k dielectric materials, here represented as 212T, may be greater than a combined thickness of any non-high-k dielectric materials, represented herein as the sum of the thickness values 213T and 211T. In this manner, it may be ensured that the dominant contribution to the physical thickness stems from the high-k dielectric material, which, on the other hand, provides a moderately low contribution to the overall oxide equivalent thickness. For example, when designing the physical thickness of the buried insulating layer stack 210 to 25 nm, a thickness of 2 nm for each of the layers 213 and 211 may be required in view of process and device characteristics, and the remaining 21 nm may be contributed by one or more high-k dielectric layers, such as the layer 212 having the thickness 212T. When using a hafnium oxide-based material having a relative permittivity of 25, an equivalent oxide thickness of 7.3 nm is obtained, thereby providing an efficient capacitive coupling between the channel region 231 and the semiconductor body region 202A, while the physical thickness of 25 nm provides sufficient physical separation of these regions.

Consequently, upon further device scaling, a relatively high physical thickness may be maintained, while, nevertheless, the oxide equivalent thickness may be appropriately reduced so as to comply with requirements for superior channel controllability, thereby establishing a real dual gate control regime. It should be appreciated that, when using high-k dielectric materials of even higher relative permittivity, the oxide equivalent thickness may be even further reduced, while still preserving a given physical thickness.

Figure 3A:
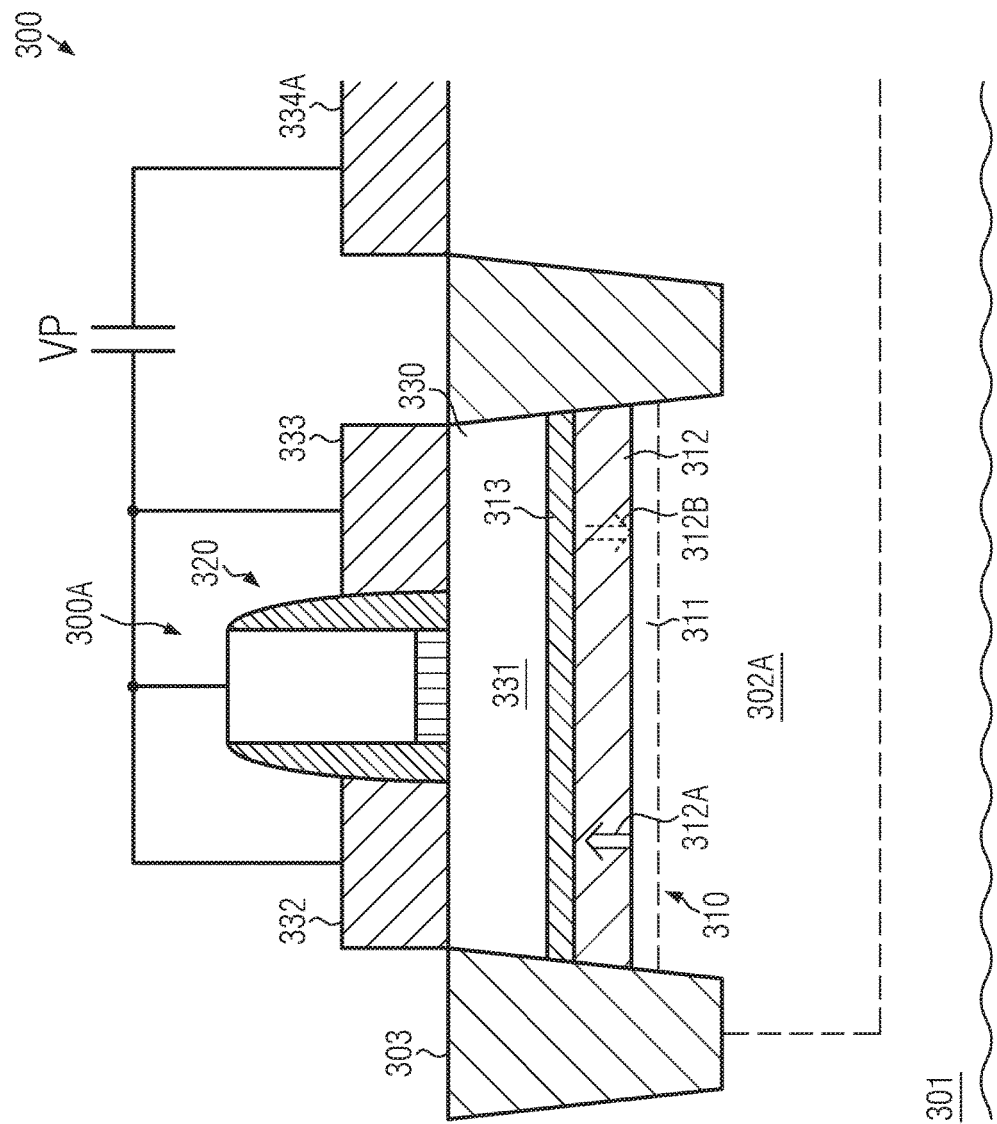
FIG. 3A schematically illustrates a cross-sectional view of a transistor element formed on the basis of a buried insulating layer, including a ferroelectric material in a state in which a control voltage may be applied so as to adjust a specific polarization state, according to illustrative embodiments.

FIG. 3A schematically illustrates a cross-sectional view of a semiconductor device 300 according to further illustrative embodiments. The semiconductor device 300 may comprise a transistor element 300A comprising a gate electrode structure 320 formed on and above a channel region 331, which represents a portion of a semiconductor layer 330 comprising or being connected to respective source and drain regions 332, 333, thereby laterally delineating the channel region 331. Furthermore, isolation structures 303 may be provided so as to laterally delineate the semiconductor layer 330. Furthermore, a buried insulating layer stack 310 may be provided and may include at least a ferroelectric material 312 in combination with one or more buffer layers, such as a layer 313 and a layer 311, for separating the ferroelectric layer 312 from the semiconductor layer 330 on the one hand, and from a semiconductor body region 302A on the other hand. The buffer layers 313, 311 may be formed of any appropriate material, such as silicon dioxide, silicon nitride, high-k dielectric materials, or any combination thereof. It should be appreciated, however, that one or both of the buffer layers 313, 311 may be optional. Furthermore, the semiconductor body region 302A may be connected to a contact region 334A, which may have a similar configuration as the drain and source regions 333, 332.

Basically, the transistor element 300A may have a configuration similar to the transistor elements described previously with reference to the semiconductor devices 100 and 200, with respect to any components, except for the buried insulating layer 310. That is, the gate electrode structure 320, the semiconductor layer 330 and, thus, the source and drain regions 332, 333 and the channel region 331, may be provided in accordance with device requirements and may have a configuration as previously discussed. Similarly, a semiconductor body region 302A may be provided as a doped semiconductor region so as to connect to the connect region 334A in order to form, in combination with the semiconductor layer 330 and the buried insulating layer stack 310, a capacitive structure, wherein the dielectric of the capacitive structure is formed mainly by the ferroelectric material 312.

It should be appreciated that a plurality of high-k dielectric materials may also exhibit ferroelectric characteristics, such as dielectric materials based on hafnium, oxygen and silicon and the like. Other candidates for a ferroelectric material include, for example, $LiNbO_3$, $Bi_4Ti_3O_{12}$ (BIT), $Bi_{4-x}La_xTi_3O_{12}$ (BLT), $Bi_3TiNbO_9$ (BTN), $SrBi_2Ta_2O_9$ (SBT), $Ba_xSr_{1-x}TiO_3$ (BST), $SrTiO_3$ (STO), and many other compositions. Consequently, the layer 312 may have characteristics and may be formed in compliance with materials and manufacturing techniques as are efficiently used for forming gate electrode structures having incorporated therein a ferroelectric material so as to provide a non-volatile, yet programmable, variation of channel conductivity. It is well known that, upon applying an external electric field across a ferroelectric material, a respective polarization state may be induced, which may even be preserved after removal of the external electrical field, and may prevail even further upon reestablishing a further external field, as long as this external field does not exceed a certain threshold. Consequently, ferroelectric transistors are typically operated on the basis of a "normal" operating voltage which does not essentially affect a previously established polarization state of a ferroelectric material positioned in the vicinity of a channel region, thereby inducing a specific threshold voltage of a transistor under consideration. On the other hand, when applying a voltage across the ferroelectric material exceeding the threshold and having an opposite polarity with respect to the previously established polarization state, polarization in the ferroelectric material may be reversed and, thus, a significantly different influence on the channel region and, thus, a significantly different threshold voltage, may be induced. In this manner, for instance, a non-volatile storage transistor may be implemented in a gate electrode structure.

By applying these principles to the buried insulating layer or layer stack 310, a corresponding modulation of the conductivity of the channel 331 may also be obtained, however, without requiring incorporation of sophisticated ferroelectric materials into the gate electrode structure 320. In this manner, the overall complexity of the gate electrode structure 320 may be significantly reduced compared to a conventional ferroelectric transistor element, and negative effects during operation of a conventional ferroelectric transistor element may be avoided or at least significantly reduced, since high voltages required for establishing a desired polarization state in the ferroelectric material positioned in the gate electrode structure may no longer be necessary by positioning the ferroelectric material in the buried insulating stack 310.

It should be appreciated that the buried insulating layer stack 310 including the ferroelectric material 312 may be provided across the entire semiconductor device 300, i.e., across an entire substrate material 301 thereof, or, in other illustrative embodiments, may be provided locally within the substrate 301 at specific device regions, which may require non-volatile storage transistors and/or transistor elements with superior back-bias behavior, as provided by the ferroelectric material 312. Moreover, the buried insulating layer stack 310 may be formed on the basis of an appropriate carrier substrate including the substrate material 301, locally or globally, as discussed above, for instance, by forming and treating the ferroelectric material 312 on a surface of the substrate material 301, possibly followed by the buffer layer 313 so as to provide similar surface characteristics as are also obtained for a standard SOI carrier substrate.

It should be appreciated that when forming the buried insulating layer stack 310 in a local manner, for instance, by forming recesses and filling the recesses with the ferroelectric material 312, respective planarization techniques may be applied so as to obtain a substantially planar surface typography prior to bonding the carrier substrate to a donor substrate including an initial version of the semiconductor layer 330. During this process, the optional layer 313 may also be provided and planarized so as to obtain the desired surface characteristics. Thereafter, the further processing may be continued, as is also discussed above with reference to the semiconductor devices 100 and 200.

Upon operating the transistor element 300A, an appropriate programming voltage, indicated as VP, may be applied to the contact region 334A and, thus, to the semiconductor body region 302A, the drain and source regions 333, 332 and the gate electrode 320, as schematically illustrated in FIG. 3A. Consequently, when selecting an appropriately high programming voltage, for instance approximately 5 V, a polarization state 312A may be established in the material 312, thereby also providing a permanent, yet programmable, electric field in the channel region 331, and inducing, for instance, a respective threshold voltage. Upon applying the reverse programming voltage VP, an opposition polarization state 312B may be established, thereby obtaining a significantly different threshold voltage and, thus, different conductivity.

Figure 3B:
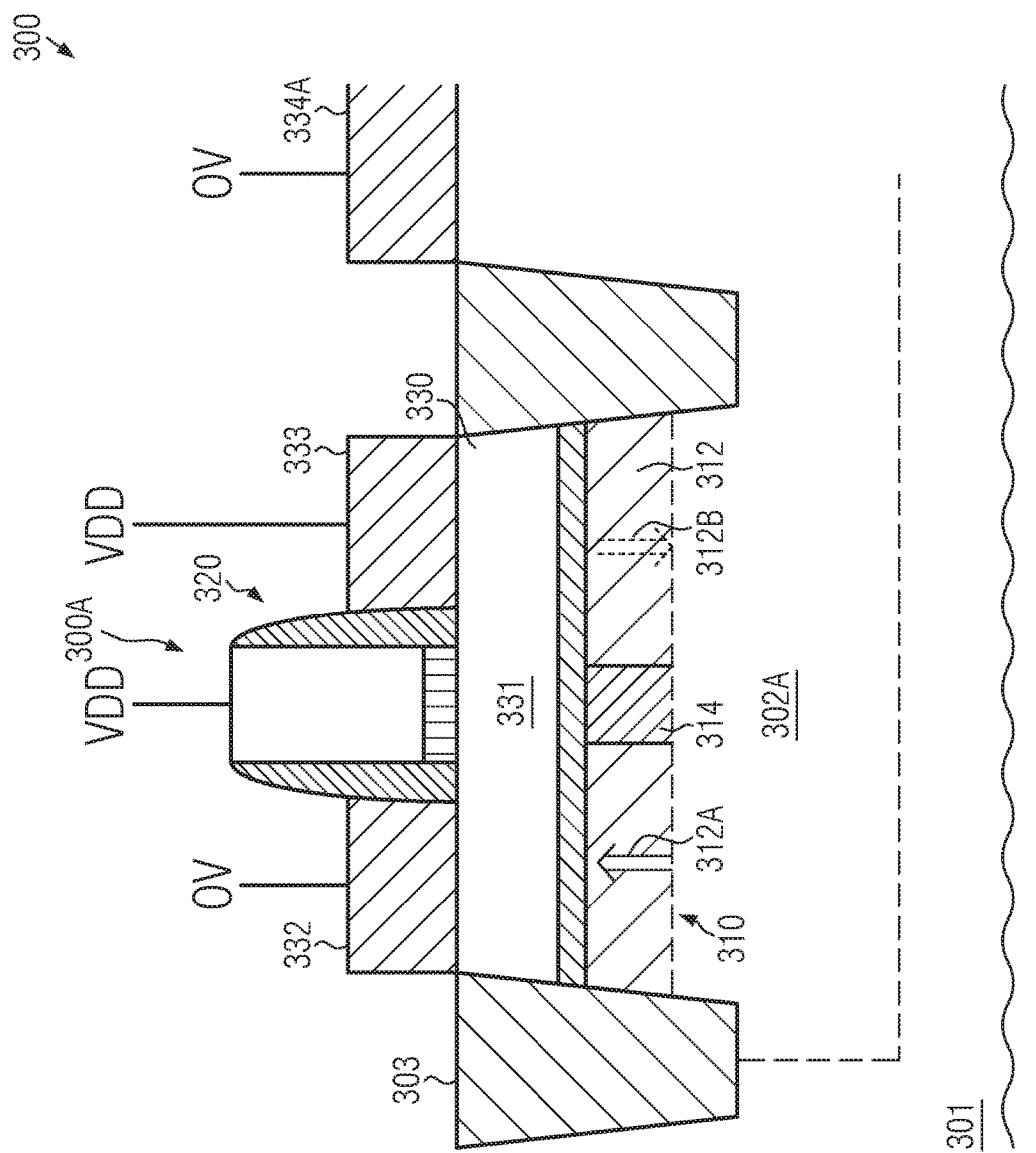
FIG. 3B schematically illustrates the transistor element of FIG. 3A during "normal" operation, in which the standard control gate electrode structure receives a signal on the basis of the standard operating voltage of the transistor element, according to further illustrative embodiments.

FIG. 3B schematically illustrates the semiconductor device 300 during a "normal" operational phase in which the operating voltage VP (see FIG. 3A) has been removed and the semiconductor body region 302A may be connected to an appropriate reference voltage (OV), such as ground potential, as may also be applied to the source region 332. On the other hand, a logic signal may be applied to the gate electrode structure 320 based on the normal operating voltage VDD, which may be approximately 1 V when considering, for instance, sophisticated fully depleted SOI transistors formed on the basis of a gate length of 30 nm and less. Consequently, a threshold voltage of the transistor element 300A is, in addition to the overall transistor configuration, substantially determined by the polarization state in the material 312, thereby having an efficient mechanism for, for instance, storing information in the transistor 300A and/or operating the transistor 300A on the basis of a permanently established electric field serving as a "back-bias voltage."

When requiring a different state of the ferroelectric material 312, for instance, for establishing the polarization state 312B, a corresponding programming voltage may be applied, as discussed above with reference to FIG. 3A. It should be appreciated that, in particular, when using the buried insulating layer stack 310 as a back-bias mechanism, the respective adjustment of an appropriate polarization state may be achieved during a specific manufacturing phase, such as electric testing or burn-in, on the basis of external equipment providing the required programming voltage, as also discussed above. In this case, any respective internal voltage sources may no longer be necessary. On the other hand, if a more dynamic behavior is desired, respective programming voltages may be established on the basis of voltage sources, such as charge pumps and the like. As already discussed, also in this case, a corresponding complex timing control may not be necessary, since the corresponding "back-bias voltage" provided by the polarization states 312A, 312B, respectively, may be considered as an instant voltage upon applying a logic signal to the gate electrode structure 320.

When using the transistor element 300A as a non-volatile memory cell, it is to be noted that a corresponding voltage drop upon programming the ferroelectric material 312 may be less pronounced in the gate electrode structure 320 compared to conventional ferroelectric non-volatile memory cells, which require a respective thick gate dielectric material so as to withstand the high programming voltage. Also, in this case, the configuration of the gate electrode structure 320 is less demanding compared to conventional ferroelectric transistor elements.

Furthermore, by appropriately adjusting a thickness of the ferroelectric material 312 and/or by incorporating one or more buffer layers into the layer stack 310, the corresponding influence on the channel region 331 may be adjusted so as to comply with design requirements. For instance, different "back-bias voltages" may be obtained by providing, for otherwise identical configurations, a different thickness for different transistor elements, which may be readily accomplished by respective masked etch steps during the manufacturing of the insulated layer stack 310. In other cases, one or more buffer portions 314, for instance, comprising a conventional dielectric material such as silicon dioxide and the like, may be provided in the layer 312 that may then have substantially identical thickness across a respective area, in which the buried insulating layer stack 310 is to be implemented. By varying the size and/or number of the buffer portions 314, the resulting influence on the channel region 331 may also be modulated, thereby also obtaining different "back-bias voltage" conditions. The buffer portions 314 may be readily formed prior to or after formation of the ferroelectric layer 312, for instance, by etch, deposition and planarization techniques.

It should be appreciated the two or more of the above-described concepts of engineering the buried insulating material of sophisticated SOI transistors may be combined as deemed appropriate for a specific application. For instance, a high-k dielectric material may be implemented so as to reduce the oxide equivalent thickness of the buried insulating layer while at the same time acting as a charge trapping layer. Similarly, the ferroelectric material may be used in combination with a high-k dielectric layer so as to provide reduced oxide equivalent thickness and enhanced control of channel conductivity. Also, a charge trapping layer may be combined with a ferroelectric material.

As a result, the present disclosure provides semiconductor devices in which transistor elements are formed on the basis of an SOI architecture including an appropriately engineered buried insulating layer or layer stack that may provide enhanced functionality and/or performance by incorporating a charge-trapping layer and/or a high-k dielectric material and/or a ferroelectric material. In this manner, non-volatile, yet programmable, storage mechanisms and/or back-bias voltage mechanisms may be provided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A transistor element, comprising
a channel region formed in a semiconductor layer and being laterally positioned between a drain region and a source region;
a control gate electrode structure formed on said channel region;
a buried insulating layer stack formed below said semiconductor layer and comprising at least two different dielectric material layers; and
a semiconductor body region formed below said buried insulating layer stack and being connected for receiving a control voltage, wherein said semiconductor body region comprises first and second doped regions, said second doped region is of inverse conductivity type compared to said first doped region, a first portion of said first doped region and a second portion of said second doped region directly contact said buried insulating layer stack, said first and second portions are disposed vertically below and overlapping said control gate electrode structure when viewed from above said control gate electrode structure, and said first portion is disposed vertically below and overlapping one of said source region or said drain region, and said second portion is disposed vertically below and overlapping the other of said source region or said drain region.

2. The transistor element of claim 1, wherein said buried insulating layer stack comprises a charge trapping layer.

3. The transistor element of claim 2, wherein said charge trapping layer comprises at least one of nitrogen and hafnium.

4. The transistor element of claim 2, wherein said buried insulating layer stack further comprises a blocking dielectric layer formed so as to separate said charge trapping layer from said semiconductor layer.

5. The transistor element of claim 2, wherein said buried insulating layer stack further comprises a charge tunneling layer formed so as to enable charge carrier tunneling therethrough and separate said charge trapping layer from said semiconductor body region.

6. The transistor element of claim 1, wherein said buried insulating layer stack comprises at least one high-k dielectric layer that comprises a high-k dielectric material having a permittivity of at least 20.

7. The transistor element of claim 6, wherein said buried insulating layer stack further comprises two or more non-high-k dielectric layers that comprise a dielectric material having a dielectric constant of 10 or less.

8. The transistor element of claim 6, wherein a thickness of said at least one high-k dielectric layer is greater than a thickness of any non-high-k dielectric layer of said buried insulating layer stack.

9. The transistor element of claim 8, wherein a thickness of said at least one high-k dielectric layer is greater than a combined thickness of all non-high-k dielectric layers of said buried insulating layer stack.

10. The transistor element of claim 1, wherein said buried insulating layer stack comprises a ferroelectric layer having a configuration so as to enable establishing a polarization that is oriented substantially perpendicular to a current flow direction in said channel region.

11. The transistor element of claim 10, wherein said buried insulating layer stack further comprises a non-ferroelectric dielectric layer formed so as to separate said ferroelectric layer from said semiconductor layer.

12. A transistor element, comprising:
a channel region formed in a semiconductor layer and being laterally positioned between a drain region and a source region;
a control gate electrode structure formed on said channel region;
a buried insulating layer formed below said semiconductor layer and comprising a charge trapping material; and
a semiconductor body region formed below said buried insulating layer and being connected for receiving a control voltage, wherein said semiconductor body region comprises first and second doped regions for adjusting a type of charge carriers to be trapped in said charge trapping layer, said second doped region is of inverse conductivity type compared to said first doped region, a first portion of said first doped region and a second portion of said second doped region directly contact said buried insulating layer, said first and second portions are disposed vertically below and overlapping said control gate electrode structure when viewed from above said control gate electrode structure, and said first portion is disposed vertically below and overlapping one of said source region or said drain region, and said second portion is disposed vertically below and overlapping the other of said source region or said drain region.

13. The transistor element of claim 12, further comprising a buffer dielectric layer formed above said charge trapping material so as to separate said charge trapping material from said semiconductor layer.

14. The transistor element of claim 13, further comprising a further dielectric layer formed below said charge trapping material so as to separate said charge trapping material from said semiconductor body region.

15. The transistor element of claim 12, wherein said charge trapping material comprises at least one of nitrogen and hafnium.

16. A transistor element, comprising:
- a channel region formed in a semiconductor layer and being laterally positioned between a drain region and a source region;
- a control gate electrode structure formed on said channel region;
- a buried insulating layer formed below said semiconductor layer and comprising a high-k dielectric material; and
- a semiconductor body region formed below said buried insulating layer and being connected for receiving a control voltage, wherein said semiconductor body region comprises first and second doped regions, said second doped region is of inverse conductivity type compared to said first doped region, a first portion of said first doped region and a second portion of said second doped region directly contact said buried insulating layer, said first and second portions are disposed vertically below and overlapping said control gate electrode structure when viewed from above said control gate electrode structure, and said first portion is disposed vertically below and overlapping one of said source region or said drain region, and said second portion is disposed vertically below and overlapping the other of said source region or said drain region.

17. The transistor element of claim 16, wherein said high-k dielectric material comprises a dielectric material having a permittivity of 20 or higher.

18. The transistor element of claim 17, further comprising at least one non-high-k dielectric layer separating said high-k dielectric material from said semiconductor layer.

\* \* \* \* \*